(12) United States Patent
Kawasaki et al.

(10) Patent No.: US 6,807,244 B2
(45) Date of Patent: Oct. 19, 2004

(54) FREQUENCY SYNTHESIZER

(75) Inventors: Somei Kawasaki, Urawa (JP); Fujio Kawano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 684 days.

(21) Appl. No.: 09/736,852

(22) Filed: Dec. 14, 2000

(65) Prior Publication Data

US 2001/0006544 A1 Jul. 5, 2001

(30) Foreign Application Priority Data

Dec. 17, 1999  (JP) ............................................ 11-358774
Jul. 31, 2000  (JP) ...................................... 2000-231644

(51) Int. Cl.[7] ................................................ H03D 3/24
(52) U.S. Cl. ........................ 375/376; 375/373; 375/327
(58) Field of Search ................................ 375/376, 375, 375/340, 344, 373, 354, 356, 355, 327, 294, 215; 331/14, 25; 713/503, 500; 327/156, 158; 455/260

(56) References Cited

U.S. PATENT DOCUMENTS

| | | | | |
|---|---|---|---|---|
| 5,448,193 A | * | 9/1995 | Baumert et al. | ............. 327/156 |
| 6,081,905 A | * | 6/2000 | Larsson et al. | ............. 713/503 |
| 6,373,911 B1 | * | 4/2002 | Tajima et al. | ................ 375/375 |
| 6,563,888 B1 | * | 5/2003 | Toriyama | ..................... 375/340 |

* cited by examiner

Primary Examiner—Shuwang Liu
Assistant Examiner—Ted Wang
(74) Attorney, Agent, or Firm—Cowan, Liebowitz & Latman

(57) ABSTRACT

The invention proposes a frequency synthesizer for generating an output signal having a frequency associated with that of a reference clock, in which a control oscillating circuit generates a clock signal group including a plurality of clock signals having a phase difference associated with the period of the output signal, and the oscillating frequency of the control oscillating circuit is controlled in accordance with the phase difference between a comparison clock generated by selectively using the plurality of clock signals, and the reference clock.

16 Claims, 14 Drawing Sheets

FIG. 4

| STATE | KA | KB |
|---|---|---|
| 0 | K0 | K1 |
| 1 | K2 | K1 |
| 2 | K2 | K3 |
| 3 | K4 | K3 |
| 4 | K4 | K5 |
| 5 | K6 | K5 |
| 6 | K6 | K7 |
| 7 | K0 | K7 |

FIG. 6A

| | Kv | s2a | s2b | s2c | s2d | s2e | s2f | s2g | s2h |
|---|---|---|---|---|---|---|---|---|---|
| A | 8×KA+0×KB | 0 | 0 | 0 | 0 | 0 | 0 | 0 | 0 |
| B | 7×KA+1×KB | 1 | 0 | 0 | 0 | 0 | 0 | 0 | 0 |
| C | 6×KA+2×KB | 1 | 1 | 0 | 0 | 0 | 0 | 0 | 0 |
| D | 5×KA+3×KB | 1 | 1 | 1 | 0 | 0 | 0 | 0 | 0 |
| E | 0×KA+8×KB | 1 | 1 | 1 | 1 | 1 | 1 | 1 | 1 |

FIG. 6B

| Kv | | s2a | s2b | s2c | s2d | s2e | s2f | s2g | s2h |
|---|---|---|---|---|---|---|---|---|---|
| a | 8×KB+0×KA | 1 | 1 | 1 | 1 | 1 | 1 | 1 | 1 |
| b | 7×KB+1×KA | 1 | 1 | 1 | 1 | 1 | 1 | 1 | 0 |
| c | 6×KB+2×KA | 1 | 1 | 1 | 1 | 1 | 1 | 0 | 0 |
| d | 5×KB+3×KA | 1 | 1 | 1 | 1 | 1 | 0 | 0 | 0 |
| e | 0×KB+8×KA | 0 | 0 | 0 | 0 | 0 | 0 | 0 | 0 |

FIG. 8

| fv-tr | DF | (0) n | (0) n-1 | (1) n | (1) n-1 | (2) n | (2) n-1 | (3) n | (3) n-1 | (4) n | (4) n-1 | (5) n | (5) n-1 | (6) n | (6) n-1 | (7) n | (7) n-1 | OPERATION PERIOD |
|---|---|---|---|---|---|---|---|---|---|---|---|---|---|---|---|---|---|---|
| -127Δf | 7Fh | 0 | 16 | 0 | 16 | 0 | 16 | 0 | 16 | 0 | 16 | 0 | 16 | 0 | 16 | 15 | 15 | 65409 |
| -126Δf | 7Eh | 0 | 16 | 0 | 16 | 0 | 16 | 0 | 16 | 0 | 16 | 0 | 16 | 0 | 16 | 15 | 15 | 65410 |
| -125Δf | 7Dh | 0 | 16 | 15 | 15 | 0 | 16 | 0 | 15 | 15 | 15 | 0 | 16 | 0 | 16 | 15 | 15 | 65411 |
| --- | --- | --- | --- | --- | --- | --- | --- | --- | --- | --- | --- | --- | --- | --- | --- | --- | --- | --- |
| -65Δf | 41h | 15 | 9 | 8 | 8 | 8 | 8 | 8 | 8 | 8 | 8 | 8 | 8 | 8 | 8 | 8 | 8 | 65471 |
| -64Δf | 40h | 8 | 8 | 8 | 8 | 8 | 8 | 8 | 8 | 8 | 8 | 8 | 8 | 8 | 8 | 8 | 8 | 65472 |
| -63Δf | 3Fh | 8 | 8 | 8 | 8 | 8 | 8 | 8 | 8 | 8 | 8 | 8 | 8 | 8 | 8 | 9 | 7 | 65473 |
| --- | --- | --- | --- | --- | --- | --- | --- | --- | --- | --- | --- | --- | --- | --- | --- | --- | --- | --- |
| -2Δf | 02h | 15 | 7 | 16 | 0 | 16 | 0 | 16 | 0 | 15 | 1 | 16 | 0 | 16 | 0 | 16 | 0 | 65535 |
| -1Δf | 01h | 0 | 16 | 16 | 0 | 16 | 0 | 16 | 0 | 0 | 0 | 16 | 0 | 16 | 0 | 16 | 0 | 65534 |
| 0 | 00h | - | - | - | - | - | - | - | - | - | - | - | - | - | - | - | - | 65536 |
| +1Δf | 81h | 15 | 1 | 16 | 0 | 16 | 0 | 16 | 0 | 15 | 1 | 16 | 0 | 16 | 0 | 16 | 0 | 65535 |
| +2Δf | 82h | 16 | 0 | 16 | 0 | 16 | 0 | 16 | 0 | 0 | 0 | 16 | 0 | 16 | 0 | 16 | 0 | 65534 |
| --- | --- | --- | --- | --- | --- | --- | --- | --- | --- | --- | --- | --- | --- | --- | --- | --- | --- | --- |
| +63Δf | BFh | 8 | 8 | 8 | 8 | 8 | 8 | 8 | 8 | 8 | 8 | 8 | 8 | 8 | 8 | 9 | 7 | 65473 |
| +64Δf | C0h | 8 | 8 | 8 | 8 | 8 | 8 | 8 | 8 | 8 | 8 | 8 | 8 | 8 | 8 | 8 | 8 | 65472 |
| +65Δf | C1h | 8 | 8 | 8 | 8 | 8 | 8 | 8 | 8 | 8 | 8 | 8 | 8 | 8 | 8 | 8 | 8 | 65471 |
| --- | --- | --- | --- | --- | --- | --- | --- | --- | --- | --- | --- | --- | --- | --- | --- | --- | --- | --- |
| +125Δf | FDh | 0 | 16 | 15 | 15 | 0 | 16 | 0 | 16 | 15 | 15 | 0 | 16 | 0 | 16 | 15 | 15 | 65411 |
| +126Δf | FEh | 0 | 16 | 0 | 16 | 0 | 16 | 0 | 16 | 0 | 16 | 0 | 16 | 0 | 16 | 15 | 15 | 65410 |
| +127Δf | FFh | 0 | 16 | 0 | 16 | 0 | 16 | 0 | 16 | 0 | 16 | 0 | 16 | 0 | 16 | 15 | 15 | 65409 |

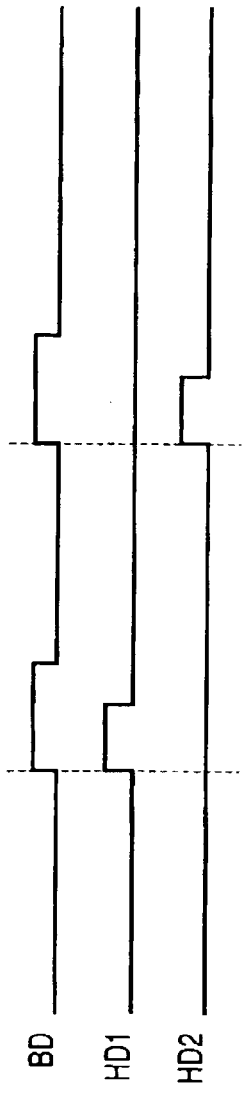
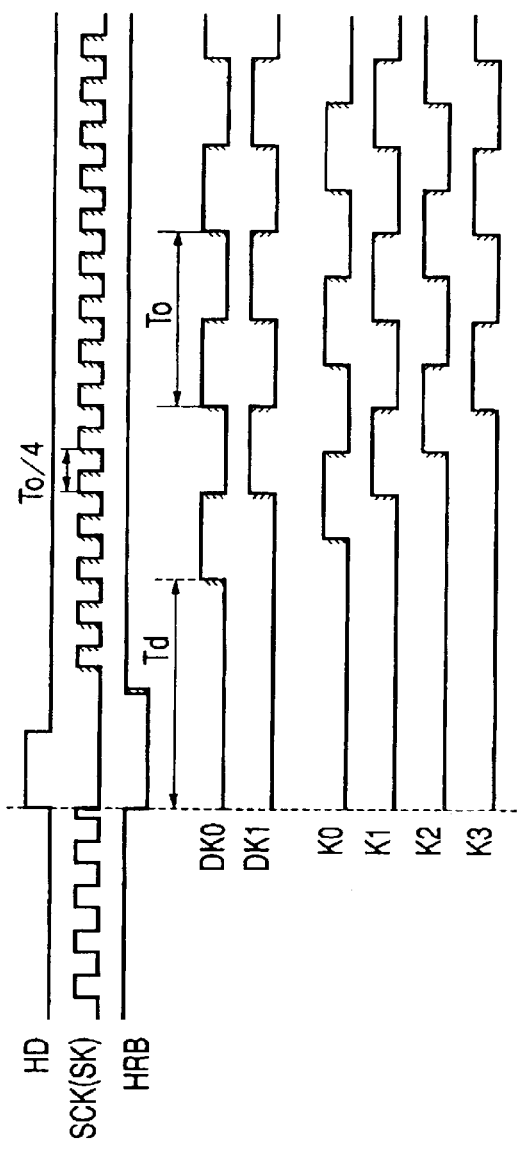

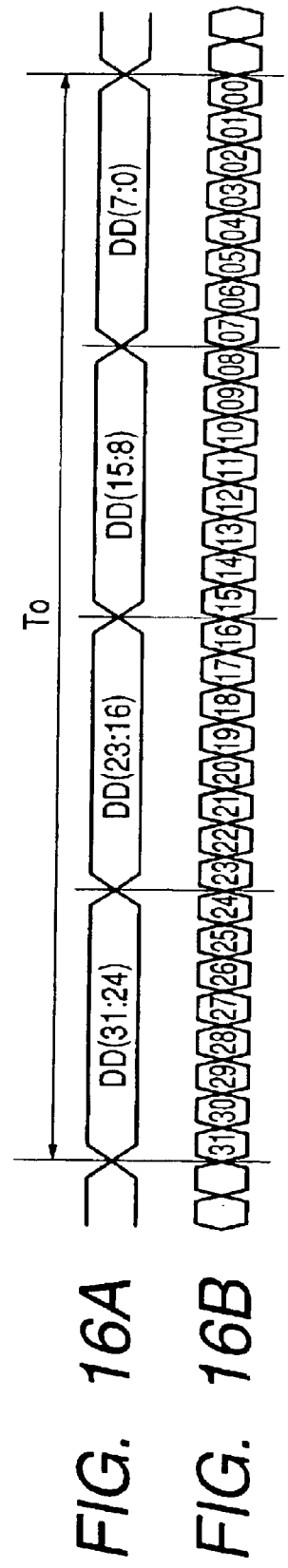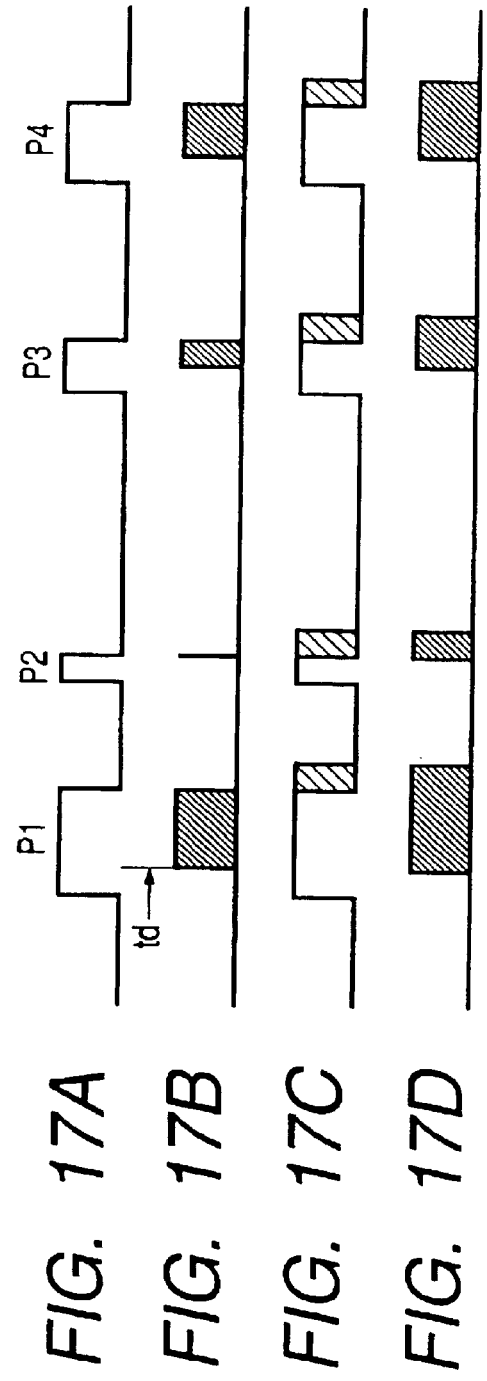
FIG. 16A
FIG. 16B
FIG. 17A
FIG. 17B
FIG. 17C
FIG. 17D

| DF VALUE | IMAGE SIZE CHANGE AMOUNT |
|---|---|
| 7Fh | +(127/128)×16=+(15+7/8) PIXELS |
| 7Eh | +(126/128)×16=+(15+6/8) PIXELS |
| ⋮ | |
| 02h | +(2/128)×16=+1/4 PIXELS |
| 01h | +(1/128)×16=+1/8 PIXELS |
| 00h | ±0 |
| 81h | −(1/128)×16=−1/8 PIXELS |
| 82h | −(2/128)×16=−1/4 PIXELS |
| ⋮ | |
| FEh | −(126/128)×16=−(15+6/8) PIXELS |
| FFh | −(127/128)×16=−(15+7/8) PIXELS |

FREQUENCY SYNTHESIZER

BACKGROUND OF THE INVENTION

1. Field of the Invention

The present invention relates to a frequency synthesizer and, more particularly, to a device that can control the frequency of output clocks with high precision.

2. Related Background Art

FIG. 21 is a schematic block diagram showing the arrangement of a conventional frequency synthesizer.

A frequency dividing circuit 110 frequency-divides a reference clock signal Kr having a frequency fr by a fixed frequency dividing value Nr, and supplies the frequency division result to a phase comparison circuit 112 as a reference signal R. A control signal generation circuit 116 supplies a driving control signal to a voltage controlled oscillator 118, which oscillates at a frequency fv corresponding to that driving control signal. An output signal Kv having the frequency fv is externally output, and is also supplied to a variable frequency dividing circuit 120. The variable frequency dividing circuit 120 frequency-divides the output from the voltage controlled oscillator 118 by a frequency dividing value Nv, and supplies the frequency division result to the phase comparison circuit 112 as a comparison signal V. The frequency division value Nv can be freely changed by frequency division value setting data DF. When the comparison signal V lags behind the reference signal R (or leads it), the phase comparison circuit 112 supplies an up pulse U (or down pulse D) to a charge pump circuit 114. The charge pump circuit 114 generates an error voltage based on the up or down pulse U or D, and supplies it to the control signal generation circuit 116. The control signal generation circuit 116 generates a driving control signal which sets the comparison signal V in phase with the reference signal R, and supplies it to the voltage controlled oscillator 118.

In the circuit shown in FIG. 21, the following relation holds:

$$fv=(Nv/Nr)\times fr$$

In this way, the circuit shown in FIG. 21 outputs a clock signal Kv having the frequency fv, which is obtained by multiplying the reference clock frequency fr by a coefficient.

In general, such frequency synthesizer is designed based on th variable frequency range and frequency setting precision. For example, assume that the variable frequency range is ±1,500 ppm or higher, and the frequency setting precision is around 15 ppm. In this case, since $$\tfrac{1}{2}^{16}=1/65536=15.25 \text{ ppm}$$

$$((65536/(65536-128))-1)*10^6=+1957 \text{ ppm}$$

$$((65536-256)/(65536-128)-1)*10^6=-1957 \text{ ppm}$$

an example of the variable frequency dividing circuit 120 can be designed as follows. That is, the number of counter bits: 16 bits
frequency division value setting data DF: 8 bits
frequency division value range: 65280 to 65536.

However, the conventional circuit suffers the following problems.

That is, when the frequency setting precision is to be improved, the frequency division value of the variable frequency dividing circuit 120 must be increased. This means that the frequency check intervals of the output signal Kv become large, and the voltage controlled oscillator 118 must hold an oscillating frequency over several ten thousand clocks in accordance with the improved frequency setting precision.

However, a voltage controlled oscillator that can maintain stable frequency over several ten thousand clocks cannot be easily realized by only a conventional versatile LSI process, and cannot be manufactured with low cost.

When such clock generation circuit is mounted in a color laser print engine, no stable operation is guaranteed in a pixel modulation circuit formed as a system LSI.

In order to stably hold an oscillating frequency in accordance with the improved frequency setting precision, the oscillation output signal must be stably controlled by not only the voltage controlled oscillator 118 but also a charge pump circuit 114 that uses a large-size capacitor which cannot be implemented by an LSI, at the cost of attack/recovery performance.

However, when attack/recovery performance is sacrificed to stably control the oscillation output signal by the charge pump circuit 114, quick output frequency switching cannot be done, resulting in a limited application range.

SUMMARY OF THE INVENTION

It is an object of the present invention to solve the aforementioned problems.

It is another object of the present invention to provide a frequency synthesize which can attain high-precision frequency control and can be formed as an LSI using a low-cost arrangement.

It is still another object of the present invention to allow to change the image position and size with high precision.

In order to achieve the above objects, according to one aspect of the present invention, there is provided a frequency synthesizer for generating an output signal having a frequency which is associated with a frequency of a reference clock, comprising:

oscillating means for generating a clock signal group including a plurality of clock signals which have a phase difference associated with a period of the output signal;

comparison clock generation means for generating a comparison clock by selectively using the plurality of clock signals;

phase difference detection means for detecting a phase difference between the reference clock and the comparison clock; and frequency control means for controlling an oscillating frequency of the oscillating means in accordance with an output from the phase difference detection means.

The above and other objects and features of the present invention will become apparent from the following detailed description of the preferred embodiments of the present invention taken in conjunction with the accompanying drawings.

BRIEF DESCRIPTION OF THE DRAWINGS

FIG. 4 is an explanatory view showing an example of the arrangement of a main phase selection circuit;

FIGS. 6A and 6B are explanatory views showing the operation of the circuit shown in FIG. 4;

FIG. 8 is a view for explaining a prescaler operation by the circuit shown in FIG. 1;

FIG. 14 is a timing chart for explaining a horizontal sync signal separation circuit;

FIG. 15 is a timing chart for explaining the operation of a time base circuit;

FIGS. 16A and 16B are timing charts for explaining a pixel modulation method;

FIGS. 17A, 17B, 17C, and 17D are timing charts for explaining the operation of a pulse width addition circuit;

DETAILED DESCRIPTION OF THE PREFERRED EMBODIMENTS

A preferred embodiment of the present invention will be described in detail hereinafter with reference to the accompanying drawings.

First, a frequency synthesizer to which the present invention is applied will be described.

Figure 1:
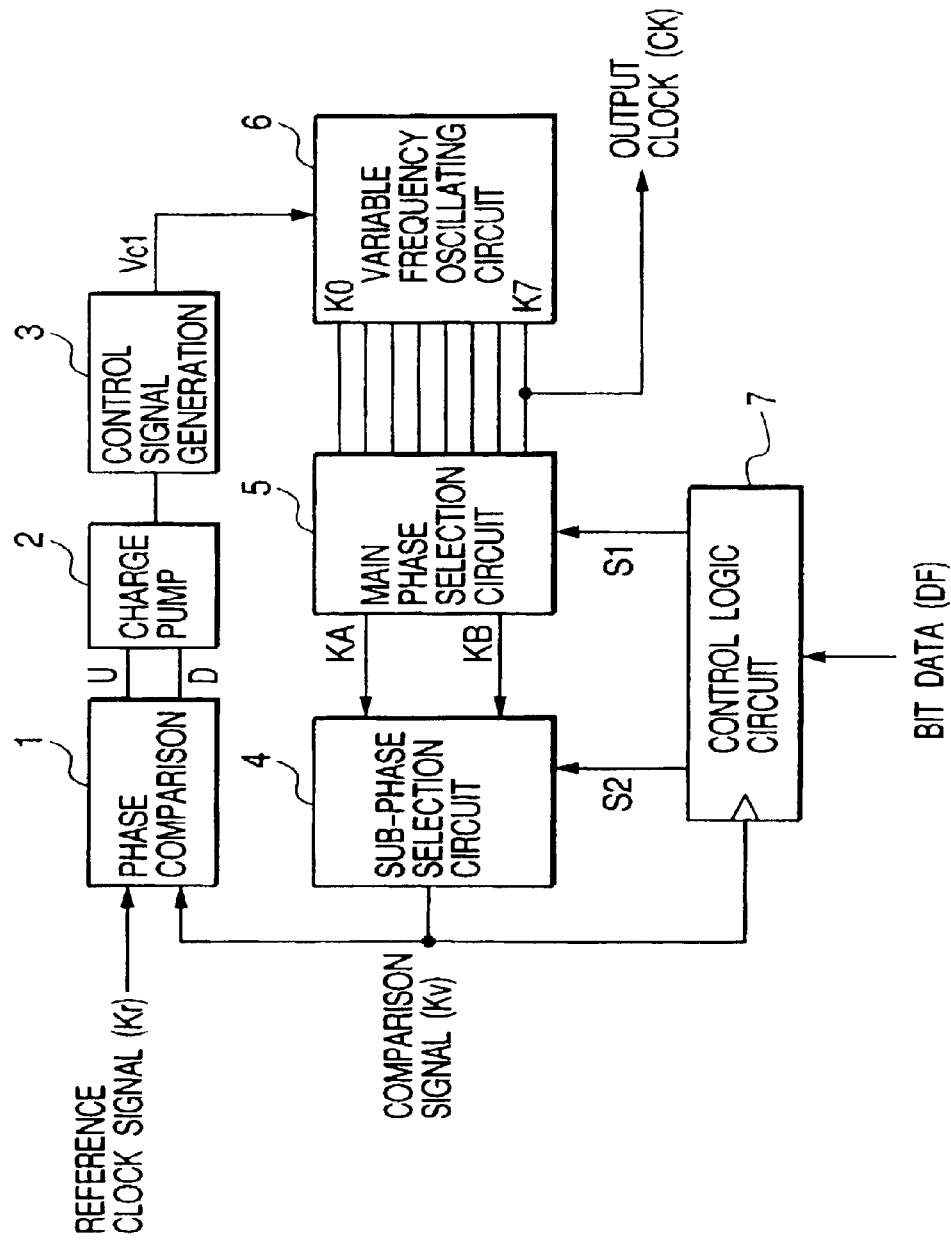
FIG. 1 is a block diagram showing an example of the arrangement of a frequency synthesizer to which the present invention is applied.

FIG. 1 is a block diagram showing an example of the arrangement of a frequency synthesizer for generating an output signal having a frequency which is obtained by multiplying a reference clock signal frequency by a coefficient.

The frequency synthesizer shown in FIG. 1 comprises a variable frequency oscillating circuit 6 for generating multi-phase clock signals K0 to K7 having a phase difference obtained by nearly equally dividing the period of an output signal, a main phase selection circuit 5 for selecting and outputting a desired pair of clock signals KA and KB of neighboring phases from the clock signals K0 to K7 in accordance with a first control signal S1, a sub-phase selection circuit 4 for selecting and outputting one clock signal Kv from the pair of clock signals KA and KB and clock phases within their phase difference in accordance with a second control signal S2, a control logic circuit 7 for generating the first and second control signals S1 and S2 on the basis of the clock signal Kv and frequency setting data DF, a phase comparison circuit 1 for receiving the clock signal Kv and a reference clock signal Kr, and a charge pump circuit 2 and control signal generation circuit 3 for controlling the variable frequency oscillating circuit 6 on the basis of the output signal from the phase comparison circuit 1.

The operation of the frequency synthesizer will be explained below.

The reference clock signal Kr is directly input to the phase comparison circuit 1 that generates general up and down pulses U and D. Of course, the reference clock signal Kr may be obtained by frequency-dividing or multiplying a source clock signal by a given value, as needed. The phase comparison circuit 1 detects the phase difference between the reference clock signal Kr and a comparison signal Kv (to be described later), and outputs an up/down pulse corresponding to the phase difference to the charge pump circuit 2.

The charge pump circuit 2 generates an error voltage in accordance with the output from the phase comparison circuit 2, and inputs it to a general control signal generation circuit 3, which outputs a control voltage Vc1.

Figure 2:
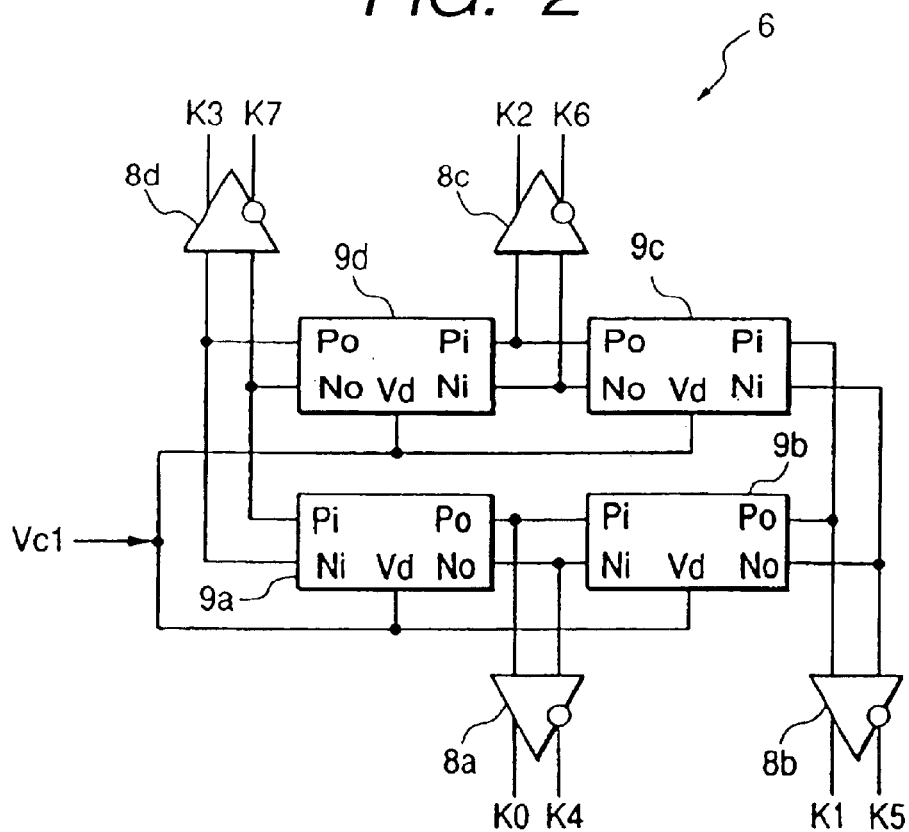
FIG. 2 is a block diagram showing an example of the arrangement of a variable frequency oscillating circuit.

The control voltage Vc1 is input to the multi-phase clock variable frequency oscillating circuit 6 shown in FIG. 2 to control the oscillating frequencies of the multi-phase clock signals K0 to K7. The multi-phase clock signals K0 to K7 are clock signals which have timings obtained by equally dividing an oscillating clock period by 8. The multi-phase clock signals K0 to K7 are input to the main phase selection circuit 5, which outputs two main selection clocks KA and KB in accordance with a phase select signal S1. One of these clock signals K0 to K7, e.g., K7 in FIG. 1, is externally output as an output clock signal of the frequency synthesizer shown in FIG. 1.

The main selection clock signals KA and Kb are input to the sub-phase selection circuit 4, which outputs a comparison signal Kv in accordance with a phase selection signal S2. The comparison signal Kv is input to the phase comparison circuit 1, and is also input as a clock signal to the control logic circuit 7.

The control logic circuit 7 receives the frequency setting data DF, and outputs the phase selection signals S1 and S2 to control the main phase selection circuit 5 and sub-phase selection circuit 4.

FIG. 2 is a block diagram showing an example of the arrangement of the multi-phase clock variable frequency oscillating circuit 6.

In this variable frequency oscillating circuit 6, differential delay circuits 9a to 9d each having the same arrangement are connected in a ring pattern. Note that the output differential signal from the differential delay circuit 9d is connected to the differential delay circuit 9a by coupling its positive/negative polarities to the negative/positive polarities of the latter, thus constituting an oscillating circuit.

Figure 3:
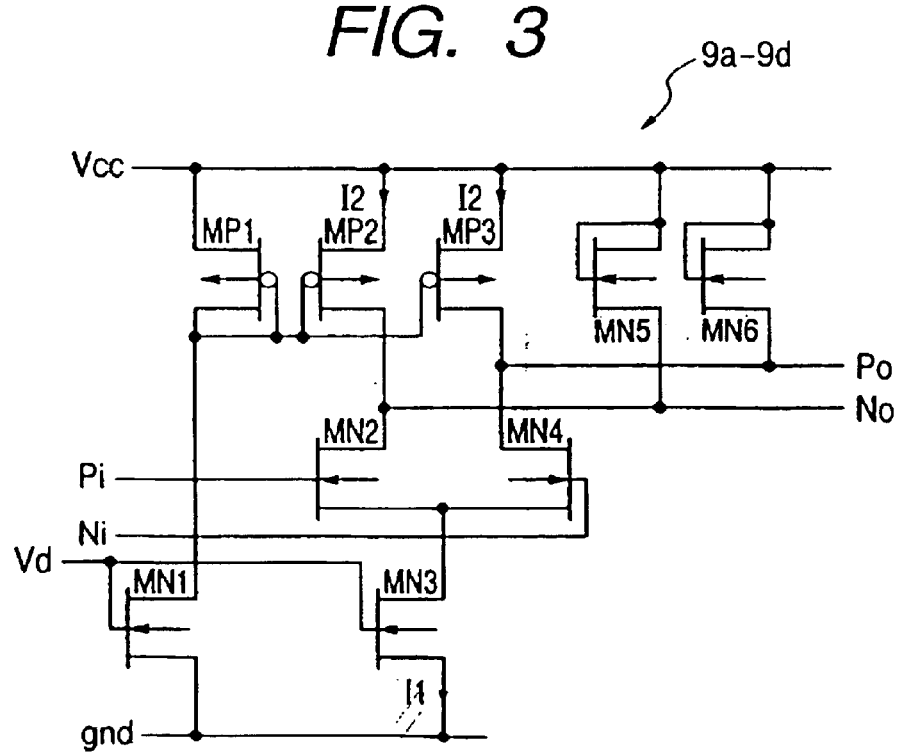
FIG. 3 is a circuit diagram showing an example of the arrangement of a differential delay circuit.

FIG. 3 shows an example of the arrangement of a CMOS circuit of the differential delay circuits 9a to 9d.

A driving voltage Vd is input to the gates of field effect transistors (FETs) MN1 and MN3. A drain current I1 of MN3 is connected to the sources of a source couple MN2 and MN4. The gates of MN2 and MN4 respectively receive positive and negative polarity signals Pi and Ni. The drain of MN1 is input to the drain of MP1, the gate-drain path of which is short-circuited, and to the gates of MP2 and MP3.

The drains of MP2 and MP3 that output a current I2 are respectively connected to the drains of MN2 and MN4, and also to the sources of MN5 and MN6, the gate-drain paths of which are short-circuited, thus outputting positive and negative polarity signals P0 and No. IfI2=I1/2, charging/discharging is made by the current I2 during the transition periods of P0 and No. Since the current is determined by the driving voltage Vd, the input/output delay time can be controlled. Hence, the delay times of the differential delay circuits 9a to 9d are ⅛ an oscillating period Tv. An oscillating frequency fv (oscillating pen Tv) can be controlled by setting a control voltage Vc to be control voltages Vd of the differential delay circuits 9a to 9d.

The differential output of the differential delay circuits 9a to 9d can output multi-phase clock signals K0 to K7 which have a phase difference corresponding to a ⅛ period via differential buffers 8a to 8d.

The aforementioned multi-phase variable oscillating circuit 6 can be easily formed in an LSI by the CMOS process.

The operation of the main phase selection circuit 5 will be described below. The main phase selection circuit 5 can assume eight states in accordance with the phase selection signal S1. FIG. 4 is a correspondence table of the output signals KA and KB in the respective states. Assume that KA and KB are differential clock signals. Output clocks of both KA and KB remain the same in two state numbers, and their clock numbers change by 2 in the subsequent state.

A sequence of:

state 0→state 7→state 0→state 7 can be realized by the phase selection signal S1.

The sub-phase selection circuit 4 will be described below.

Figure 5:
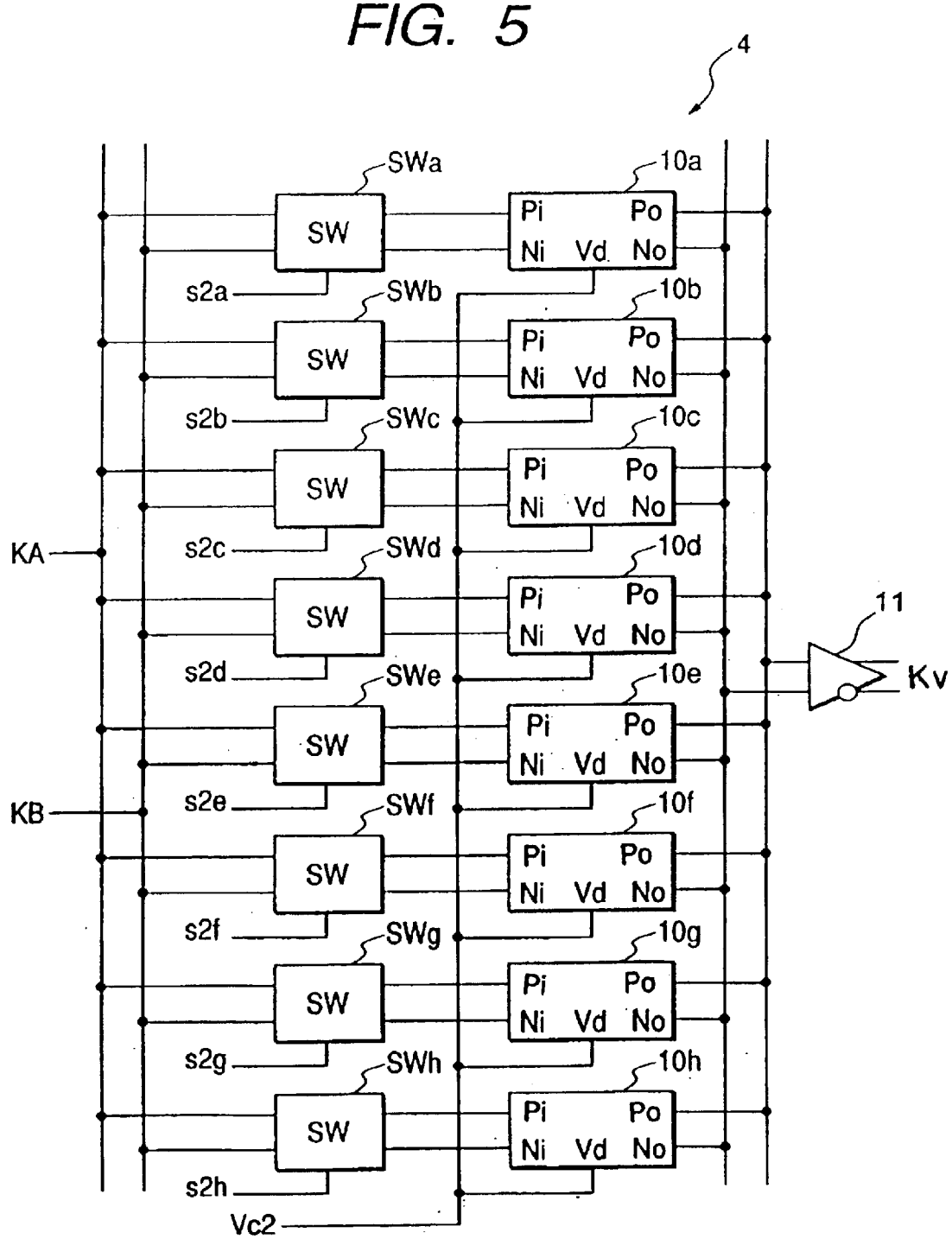
FIG. 5 is a block diagram showing an example of the arrangement of a sub-phase selection circuit.

FIG. 5 shows an example of the arrangement of the sub-phase selection circuit 4 which receives the differential clock signals KA and KB.

The signals KA and KB from the main phase selection circuit 5 are input to selection circuits SWa to SWh. The selection circuits respectively receive signal components S2a to S2h that form the phase selection signal S2, and select KA (KB) when their inputs are at L level (H level).

Output differential signals from the selection circuits Swa to Swh are input to differential delay circuits 10a to 10h. These differential delay circuits 10a to 10h have the same arrangement as that of the differential delay circuits used in the variable frequency oscillating circuit 6 described using FIG. 3.

A control voltage VC2 can be the same as the control voltage VC1 of the variable frequency oscillating circuit 6. For this reason, no new control circuit is required. The differential output terminals of the differential delay circuits 10a to 10h are connected to each other, and output a comparison clock signal Kv via a differential buffer 11. The comparison clock signal Kv can assume 10 states A to E and a to e given by state formulas shown in FIGS. 6A and 6B, and one of these states is set by the selection signals S2a to S2h. FIG. 6A shows states in case of that KB lags behind KA, and FIG. 6B shows states in case of that KB leads KA.

Figures 7A, 7B:
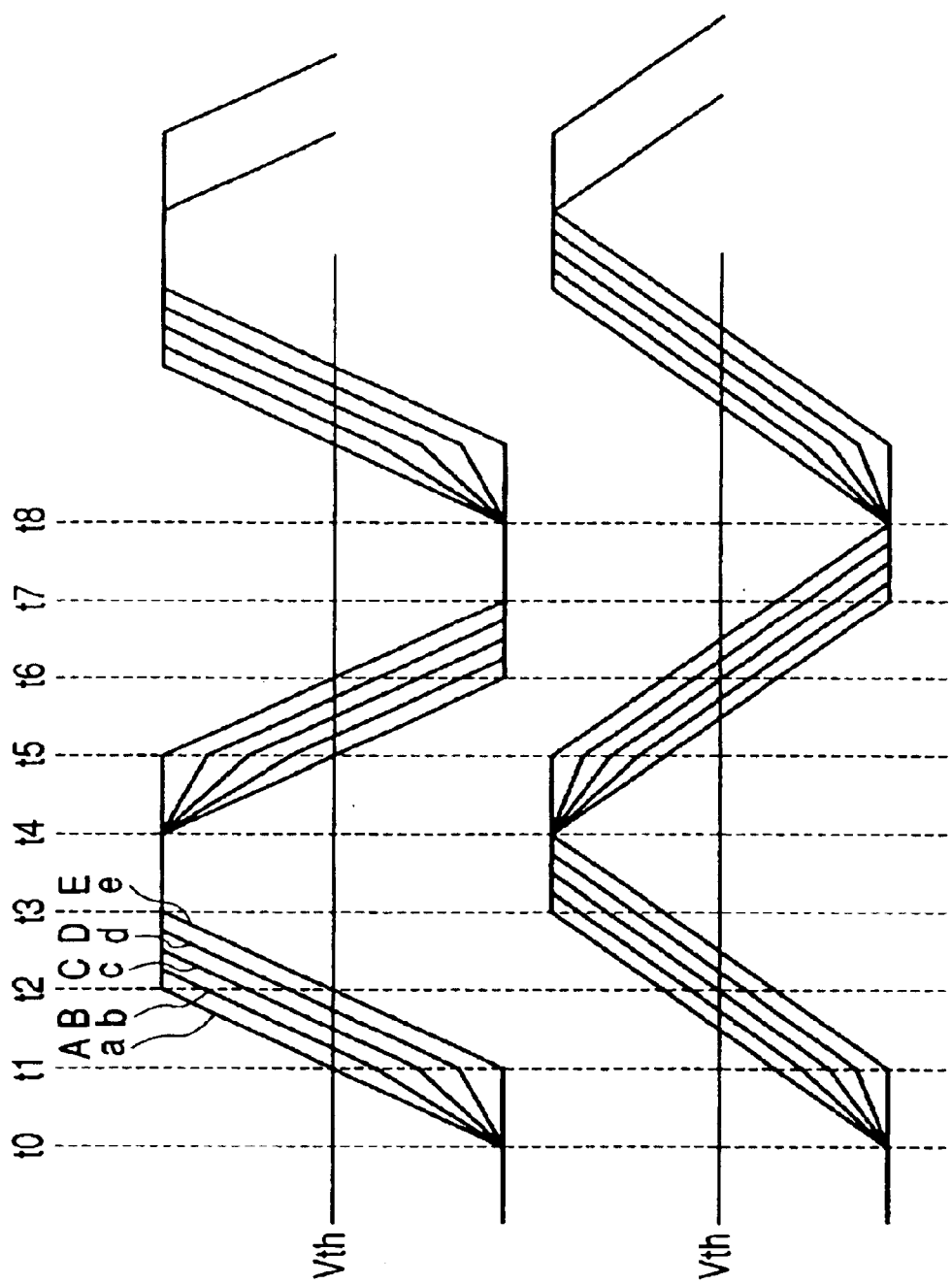
FIGS. 7A and 7B are waveform charts showing the operation of the circuit shown in FIG. 4.

FIG. 7A shows the waveform at the output coupled point of the differential delay circuits 10a to 10h as one of differential signals.

State A or a is the state in which the phase is most advanced, and charging and discharging currents in transition regions (the period from t0 to t2 and the period from t4 to t6) are 8×I2. However, since the parasitic capacitance becomes approximately eight times, the voltage rise and drop rates are nearly equal to those of the differential delay circuit output signal in the variable frequency oscillating circuit 6, and the transition time is around ¼ the clock period Tv.

In state B or b, the charging/discharging currents are (7−1)×I2=6×I2 during the period from t0 to t1 and the period from t4 to t5 and, after that, the charging/discharging currents are 8×I2 until voltage transition is complete via a threshold voltage Vth. In state D or d, the charging/discharging currents are (5−3)×I2=2×I2 during the period from t0 to t1 and the period from t4 to t5 and, after that, the charging/discharging currents are 8×I2 until voltage transition is complete via a threshold voltage Vth.

State E or e is the state in which the phase is most delayed, and charging and discharging currents during transition regions (the period from t1 to t3 and the period from t5 to t7) are 8×I2. The phase of this state lags ⅛ Tv-behind state A (a).

With the aforementioned operation, the charging/discharging waveforms in the transition regions of the respective states are as shown in FIG. 7A, and states A to E (a to e) can output clock signals, the phases of which shift 1/32 Tv from each other (obtained by equally dividing a phase).

FIG. 7B shows the operation waveforms in the respective states when the parasitic capacitance at the output coupling point of the differential delay circuits 10a to 10h becomes about 50% relatively larger than the variable oscillating circuit on the layout. Even in such case, the phase equal dividing operation is satisfied, and the aforementioned operation can be implemented. It is difficult to stably operate the differential delay circuit when its delay time is 0.5 ns or less, and it is not easy to output more than eight multi-phase clock signals by the variable frequency oscillating circuit 6 when the clock frequency has exceeded 200 Mhz.

In this embodiment, the sub-phase selection circuit 4 can easily realize fine clock phases by a logical interpolation process, which cannot be realized by the variable frequency oscillating circuit 6.

Prescaler operation will be explained first. The specifications of the frequency synthesizer are set as follows as in the prior art. That is, the variable frequency range is ±1,500 ppm or higher, and the frequency setting precision is around 15 ppm.

The control logic circuit 7 comprises a variable frequency-dividing circuit which counts n or n−1 (for n=512) comparison clock signals Kv, and divides the operation period into 128 periods. In this embodiment, the prescaler operation is implemented by collaboration among the main phase selection circuit 5, sub-phase selection circuit 4, and control logic circuit 7. The prescaler operation of this embodiment will be described below with reference to FIGS. 8, 9A and 9B, and 10A and 10B.

When fv=fr    1)

In this case, the frequency setting data DF is set at 00 h. The control logic circuit 7 forcibly fixes the phase selection signals S1 and S2. In this way, the comparison clock signal Kv has a constant phase, and the circuit shown in FIG. 1 operates as a PLL circuit that outputs the clock frequency fv equal to the reference clock frequency fr.

When fr−fv=Δf(Δf is a minimum frequency drift).

In this case, the frequency setting data DF is set at 81 h. As shown in FIG. 8, the control logic circuit 7 controls the variable frequency-dividing circuit to make n count operation once and n−1 count operations 15 times only in state 0 of the main phase selection circuit 5, and to make n count operations 16 times in states 1 to 7. The phase selection signals S1 and S2 are determined in accordance with a carry signal C of the variable frequency-dividing circuit.

Figures 9A, 9B:
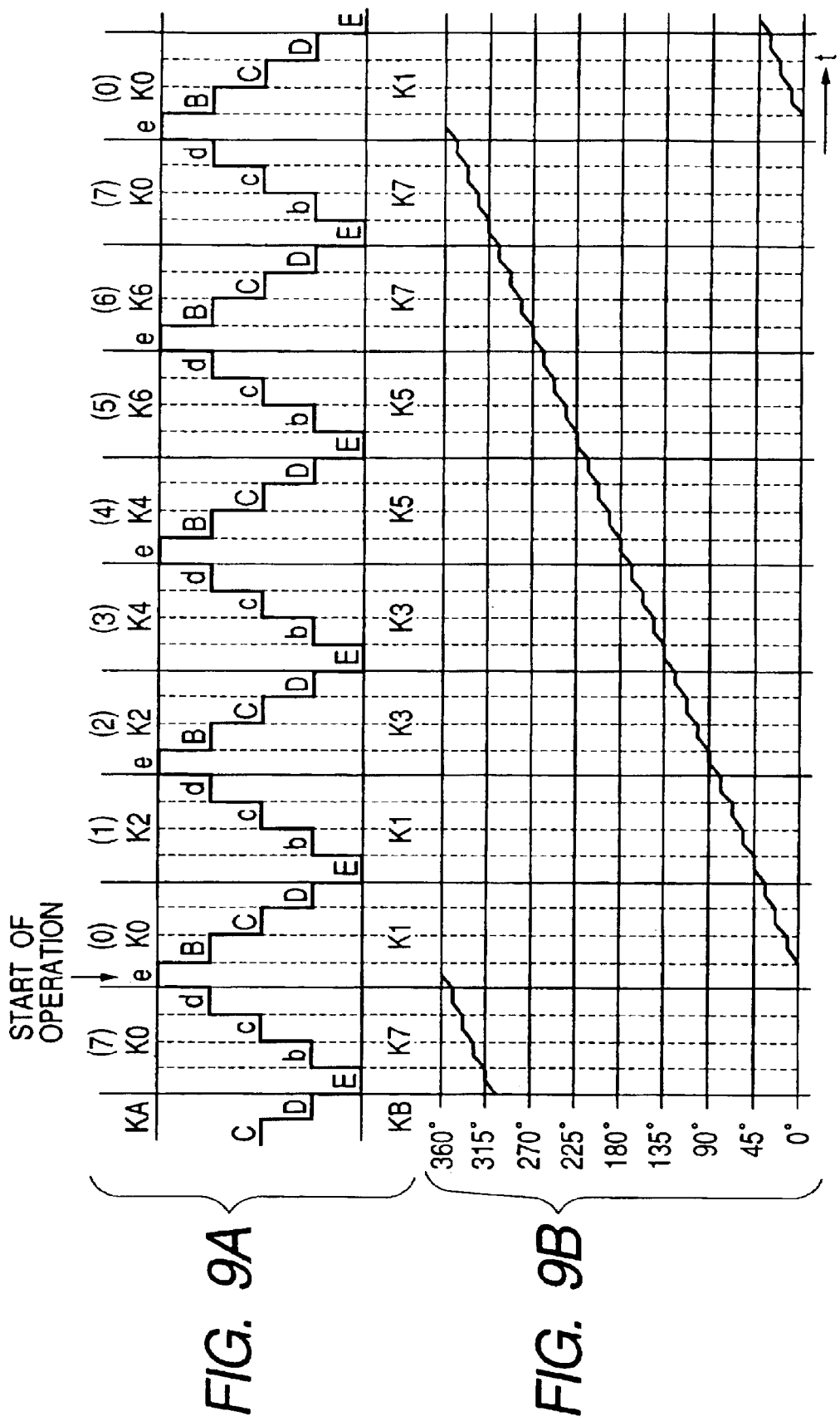
FIGS. 9A and 9B are explanatory views showing the first state of the prescaler operation.

FIGS. 9A and 9B show the operation process when fv>fr. FIG. 9A shows the operation processes of the main phase selection circuit 5 and sub-phase selection circuit 4, and FIG. 9B shows a change in phase of the comparison clock signal Kv.

The operation starts when the main phase selection circuit 5 is in state 0 and the sub-phase selection circuit 4 is in state e. When the carry signal C is generated four times (one n−1 count operation and three n count operations), the phase selection signal S2 sets the sub-phase selection circuit 4 in state B. At this time, the phase of the comparison clock signal Kv lags by 360°/32.

When the carry signal C is generated four more times (four n count operations), the phase selection signal S2 sets the sub-phase selection circuit 4 in state C. At this time, the phase of the comparison clock signal Kv further lags by 360°/32. By repeating these operations two more times, the sub-phase selection circuit 4 is set in state E, and the phase of the comparison clock signal Kv lags by 45° behind the initial phase.

At this time, the main phase selection circuit 5 shifts to state 1 in accordance with the phase selection signal S1, and the clock KA changes from K0 to K2. The sub-phase selection circuit 4 is in state E, and the output phase of the clock Kv is not influenced by a change in phase of the clock KA. In addition, the change in state of the main phase selection circuit 5 does not influence this prescaler operation when it is done within 511 (512) clock periods.

When the carry signal C is generated four more times (four n count operations), the sub-phase selection circuit 4 is set in state b in accordance with the phase selection signal S2, and the phase of the comparison clock signal Kv lags by 360°/32. When this operation is repeated three more times, the sub-phase selection circuit 4 reaches state e.

At this time, the main phase selection circuit 5 shifts to state 2 in accordance with the phase selection signal S1, and the clock KB changes from K1 to K3. The sub-phase selection circuit 4 is in state e, and the output phase of the comparison clock signal Kv is not influenced by a change in phase of the clock KB.

Then, by repeating this operation, the phase of the comparison clock signal Kv lags by 360° after 65535 clock periods (n×127+(n−1)×1). This means that the phases of the output signals K0 to K7 of the variable frequency oscillating circuit 6 lead by 360° the reference clock signal Kr in these periods. As described above, in this embodiment, the phase of the comparison clock signal Kv changes periodically, i.e., every time the carry signal C is output four times, and the phase difference between the reference signal Kr and comparison clock signal Kv is always maintained, thus controlling the frequency of the output clock to a desired frequency.

Equivalently, the output frequency fv becomes higher than the reference frequency fr:

$$fv=fr+(1/65535)fr=fr+\Delta f \qquad (1)$$

Therefore, the minimum frequency drift Δf is around 15 ppm of the reference clock frequency fr as the desired value.

In this embodiment, since the phase of the comparison clock signal Kv jumps by 360°/32, jitter of the output signal from the variable frequency oscillating circuit 6 may pose a problem. However, since the phase jump is corrected to a continuous one by the capacitive element in the charge pump circuit 3, the jitter amount can be suppressed to 1/60 periods or less that do not pose any problems in practical use even if a normal charge pump circuit is used. The interpolation amount of the sub-phase selection circuit 4 is set to be ¼ for the sake of simplicity. However, an arrangement that sets the interpolation amount of around ⅛ is easy to implement, and the jitter amount can be further suppressed in such case.

$$\text{When } fv=fr+k\times\Delta f \qquad 3)$$

In this case, the frequency setting data DF is set at 256-k. The phase delay operation of the comparison clock signal Kv by the main phase selection circuit 5, sub-phase selection circuit 4, and control logic circuit 7 is as shown in FIGS. 9A and 9B, as in the aforementioned case. One sole difference is that k (n−1) count operations of the variable frequency-dividing circuit in the control logic circuit 7 are assigned to 128 carry generation periods. In this case, if the (n−1) count operation periods are assigned as evenly as possible, the phase transition characteristics of the comparison clock signal Kv can be linear, and the best frequency stability of the output CK can be assured. Since the operation periods are (65536−k)×Tv, the output frequency is set in these operation periods. The output frequency fv is given by:

$$fv=(65536)/(65536-k)\times fr=fr+k\times\Delta f \qquad (2)$$

The maximum output frequency is obtained when the frequency setting data DF is FFh. That is, $$fv(\max)=65536/(65536-127)fr=fr+127\times\Delta f \qquad (3)$$

The frequency drift with respect to the reference clock frequency fr at that time is around 1,900 ppm, and satisfies the aforementioned condition.

$$\text{When } fv=fr-\Delta f \qquad 4)$$

In this case, the frequency setting data DF is set at 01 h. As shown in FIG. 8, the control logic circuit 7 controls the variable frequency-dividing circuit to make n count operation once and n−1 count operations 15 times only in state 0 of the main phase selection circuit 5, and to make n count operations 16 times in states 1 to 7. The phase selection signals S1 and S2 are determined in accordance with a carry signal C of the variable frequency-dividing circuit.

Figures 10A, 10B:
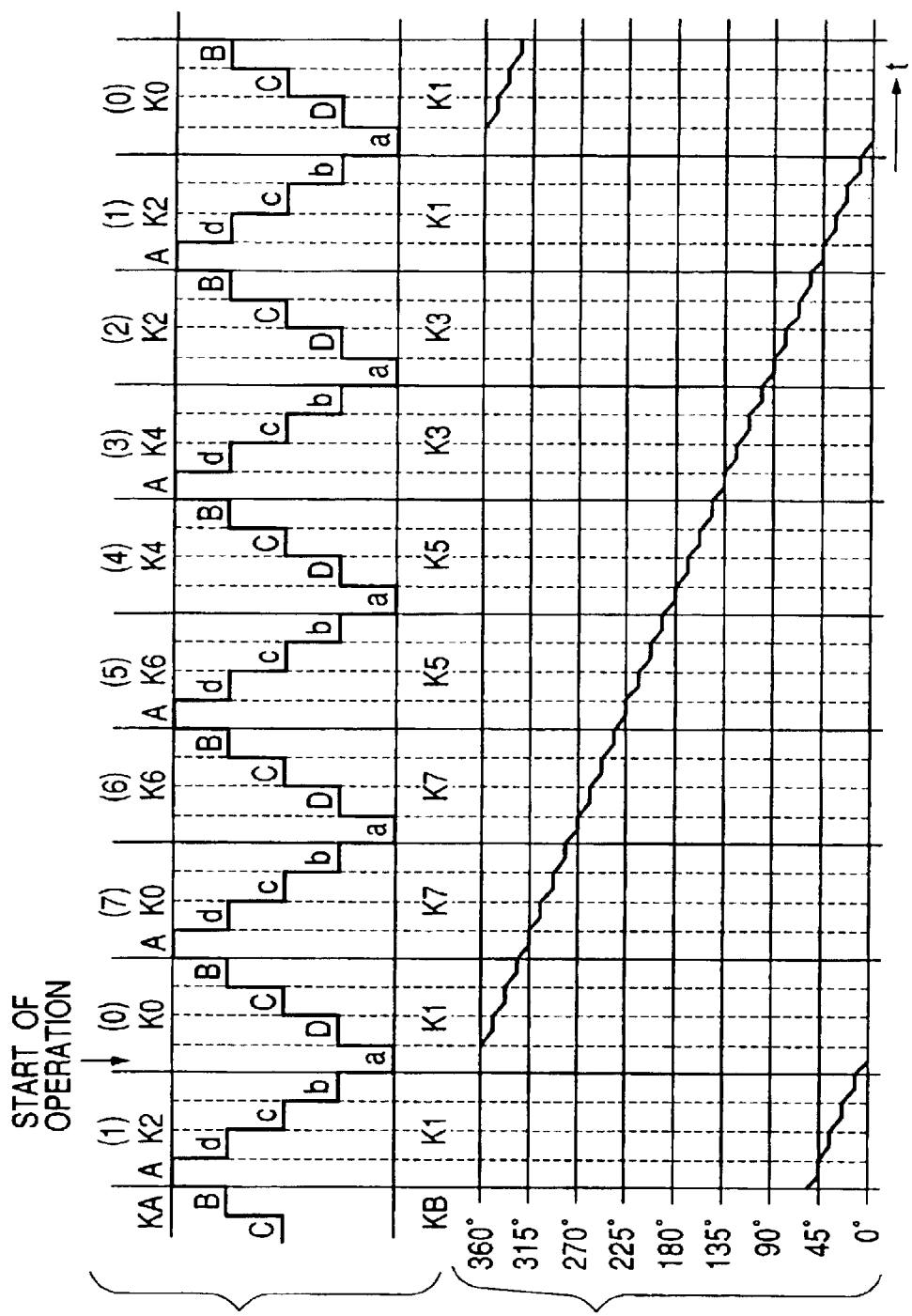
FIGS. 10A and 10B are explanatory views showing the second state of the prescaler operation.

FIGS. 10A and 10B show the operation process when fv>fr. FIG. 10A shows the operation processes of the main phase selection circuit 5 and sub-phase selection circuit 4, and FIG. 10B shows a change in phase of the comparison clock signal Kv.

The operation starts when the main phase selection circuit 5 is in state 0 and the sub-phase selection circuit 4 is in state a. When the carry signal C is generated four times (one n−1 count operation and three n count operations), the phase selection signal S2 sets the sub-phase selection circuit 4 in state D. At this time, the phase of the comparison clock signal Kv leads by 360°/32.

When the carry signal C is generated four more times (four n count operations), the phase selection signal S2 sets the sub-phase selection circuit 4 in state C. At this time, the phase of the comparison clock signal Kv further leads by 360°/32. By repeating these operations two more times, the sub-phase selection circuit 4 is set in state A, and the phase of the comparison clock signal Kv leads by 45° the initial phase. At this time, the main phase selection circuit 5 shifts to state 1 in accordance with the phase selection signal S1, and the clock KB changes from K1 to K7. The sub-phase selection circuit 4 is in state A, and the phase of the clock Kv is not influenced by a change in phase of the clock KB. In addition, the change in state of the main phase selection circuit 5 does not influence this prescaler operation when it is done within 511 (512) clock periods.

When the carry signal C is generated four more times (four n count operations), the sub-phase selection circuit 4 is set in state d in accordance with the phase selection signal S2, and the phase of the comparison clock signal Kv leads by 360°/32. When this operation is repeated three more times, the sub-phase selection circuit 4 reaches state a. The phase selection signal S1 shifts the main phase selection circuit 5 to state 6, and the clock KA changes from K0 to K6. At this time, the sub-phase selection circuit 4 is in state a, and the output phase of the comparison clock signal Kv is not influenced by a change in phase of the clock KA.

Then, by repeating this operation, the phase of the comparison clock signal Kv leads by 360° after 65535 clock periods (n×127+(n−1)×1). This means that the phases of the output signals K0 to K7 of the variable frequency oscillating circuit 6 lag by 360° behind the reference clock signal Kr in these periods.

Equivalently, the output frequency fv becomes lower than the reference frequency fr. That is, $$fv=fr-(1/65535)fr=fr-\Delta f \qquad (4)$$

Therefore, the minimum frequency drift $\Delta f$ is around 15 ppm of the reference clock frequency fr, which is desired value.

When $fv=fr-k\times\Delta f$ \qquad 5)

In this case, the frequency setting data DF is set at 256−k. The phase delay operation of the comparison clock signal Kv by the main phase selection circuit 5, sub-phase selection circuit 4, and control logic circuit 7 is as shown in FIGS. 9A and 9B. One sole difference is that k (n−1) count operations of the variable frequency-dividing circuit in the control logic circuit 7 are assigned to 128 carry generation periods. In this case, if the (n−1) count operation periods are assigned as evenly as possible, the phase transition characteristics of the comparison clock signal Kv can be linear, and the best frequency stability of the output CK can be assured. Since the operation periods are (65536−k)×Tv, the output frequency is set in these operation periods. The output frequency fv is given by:

$$fv=(65536-k)/(65536)\times fr=fr-k\times\Delta f \qquad (5)$$

The minimum output frequency is obtained when the frequency setting data DF is FFh. That is, $$fv(\min)=(65536-127)/(65536)\times fr=fr-127\times\Delta f \qquad (6)$$

The frequency drift with respect to the reference clock frequency fr at that time is around 1,900 ppm, and satisfies the aforementioned condition.

In this embodiment, since the phase comparison operation for determining the target output frequency can be done every output signal period, a general PLL circuit can be used as PLL circuit blocks such as the charge pump circuit 2, variable frequency oscillating circuit 6, and the like.

In this embodiment, the sub-phase selection circuit 4 is added for the purpose of improving the prescaler operation. However, the prescaler operation can be realized without this circuit. When no sub-phase selection circuit 4 is added, jump of the control phase must be suppressed by increasing the capacitance in the charge pump circuit 2.

The variable frequency oscillating circuit 6 directly generates multi-phase clock signals. Alternatively, a single-phase output of the variable oscillating circuit 6 may be supplied to a delay chain circuit obtained by cascade-connecting delay circuits to generate similar multi-phase clock signals.

In this embodiment, the comparison clock signal Kv is input to the control logic circuit 7 that generates the phase selection signals S1 and S2. Alternatively, since limitations in terms of timings are small for the phase selection signals S1 and S2, the clocks K0 to K7, KA, and KB may be input to the control logic circuit 7.

A change in phase of the comparison clock signal Kv will be explained below.

As described above, the phase of the comparison clock signal can be changed by 1/32 periods with high precision by controlling the selection signals S1 and S2.

For example, when the phase lags by one period during N1 clock periods, the frequency of the output clock CK becomes higher than the reference clock signal frequency fr, that is:

$$fck=fr\times N1/(N1-1) \qquad (7)$$

When the phase leads by one period during N1 clock periods, the frequency of the output clock CK becomes lower than the reference clock signal frequency fr, that is:

$$fck=fr\times N1/(N1+1) \qquad (8)$$

When the phase lags by a 1/32 period during N2 clock periods, the frequency of the output clock CK becomes higher than the reference clock signal frequency fr, that is:

$$fck=fr\times N2/(N2-1/32) \qquad (9)$$

When the phase leads by a 1/32 period during N2 clock periods, the frequency of the output clock CK becomes lower than the reference clock signal frequency fr, that is:

$$fck=fr\times N2/(N2-1/32) \qquad (10)$$

The specifications of the frequency synthesizer are set as follows as in the prior art:

(a) variable frequency range: around ±2,000 ppm (b) frequency setting precision: around 15 ppm When the period N1 is set to be 512 clock periods from equations (7) and (8) that represent the maximum frequency transition, <maximum variable frequency range: around ±2,000 ppm> can be realized; when the period N1 is set to be 2,048(4×N1) clock periods from equations (9) and (10) that represent minimum frequency transition, <frequency setting precision: around 15 ppm> can be realized.

That is, when phase control of clock periods from −128/32 (four rotations) to −1/32, 0, and from +1/32 to +128/32 (four rotations) is done during 2,048 clock periods using the frequency setting data DF, the output clock frequency can be desirably changed. The signs of the phase differences can be changed by executing the phase change control sequence in a reverse order.

In order to stabilize the operation of the charge pump circuit 2 and to assure high frequency stability, phase control intervals of 1/32 periods in the phase control period N2 under the respective conditions are preferably distributed as evenly as possible.

FIGS. 9A and 9B and FIGS. 10A and 10B show cases wherein equal phase control intervals are set. In these cases, this means that the phase change rate is constant, i.e., the frequency is constant, and a constant charge pump voltage can be obtained.

An example in which the frequency synthesizer shown in FIG. 1 is applied to an image forming apparatus will be explained below.

In the example to be described below, the frequency synthesizer shown in FIG. 1 is mounted in a 4-drum/2-beam laser print engine as an image forming apparatus.

Image Write Unit

Figure 11:
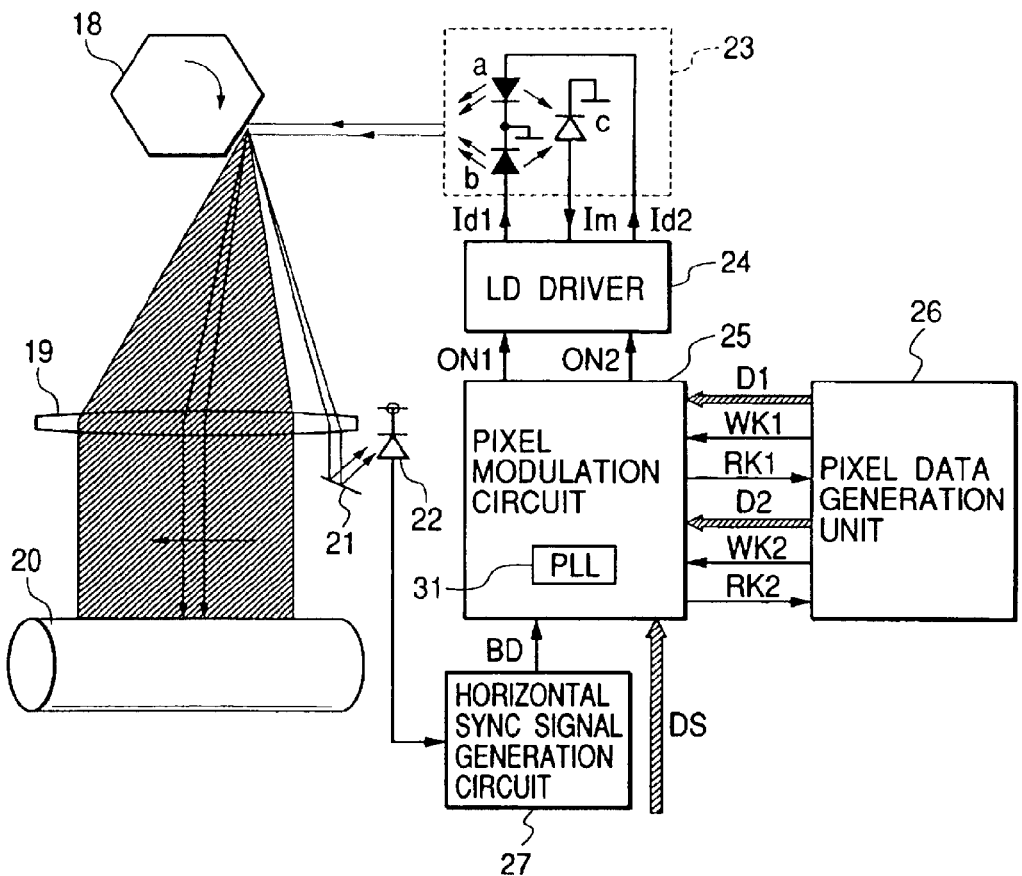
FIG. 11 is a block diagram showing an example of the arrangement of a laser print engine having a frequency synthesizer to which the present invention is applied.

Referring to FIG. 11, a laser chip 23 is of a 2-beam type having laser diodes a and b, and comprises a photodiode c for receiving back light beams.

Driving currents Id1 and Id2 that control emission of the two laser diodes are supplied from an LD driver 24. A monitor current Im obtained by detecting the light emission amount from the photodiode c is input to the LD driver 24, which executes APC (auto power control) of the light emission amounts of the laser diodes a and b.

Figure 12:
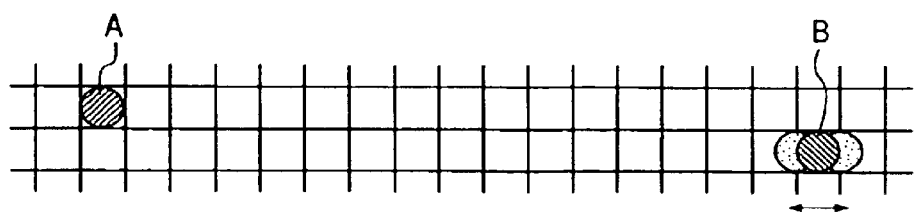
FIG. 12 is an explanatory view showing the beam layout of a two-beam laser.

The laser chip 23 cannot set the interval between the two laser light-emitting points to be one pixel (about 42 μm at 600 dpi) in terms of its element characteristics. For this reason, the laser chip 23 is obliquely set to emit two beams at positions which are, e.g., 16 pixels apart in the laser scanning direction, on pixel regions indicated by grating lines, as shown in FIG. 12.

A modulated laser beam emitted by the laser chip 23 is deflected by a polygonal mirror 18 which is fixed to a motor shaft, and rotates in the direction of an arrow in FIG. 11, and scans the surface of a photosensitive drum 20. An f-θ lens 19 is used to focus the deflected modulated laser beam on the surface of the photosensitive drum 20 at a constant linear velocity.

When the photosensitive drum 20 and print toner are electrostatically charged in advance to a given potential, since the attachment amount of print toner changes depending on the amount of light with which the photosensitive drum 20 is irradiated, a halftone image can be printed. The positional relationship between a BD mirror 21 and the photosensitive drum 20 is mechanically fixed, and a laser beam reflected by the BD mirror 21 is received by a light-receiving diode 22 and is used to detect the information write start position on the photosensitive drum 20. The output from the light-receiving diode 22 is input to a horizontal sync signal generation circuit 27 to generate a horizontal sync signal BD.

The signal BD is input to a pixel modulation circuit 25. The pixel modulation circuit 25 generates pixel clocks synchronous with the horizontal sync signal BD or clocks obtained by multiplying the pixel clocks by a coefficient. Based on the pixel clocks, the circuit 25 supplies read clocks RK1 and RK2 used to read pixel data, to a pixel data generation unit 26. The pixel data generation unit 26 outputs pixel data D1 and D2 and their write clocks WK1 and WK2 to the pixel modulation circuit 25. The circuit 25 outputs pixel modulation signals ON1 and ON2 that allow desired laser beam amount modulation, to the LD driver 24 on the basis of the input pixel data.

Pixel Modulation Circuit

The aforementioned 4-drum/2-beam laser print engine requires an LSI circuit since the pixel modulation scale is eight times that of the conventional 1-drum/1-beam laser print engine. Furthermore, since the 4-drum laser print engine has image write units shown in FIG. 11 in units of colors, position alignment must be done among color images.

That is, when the engine has four color image write units, color images suffer position errors occur due to timings errors of BD signals in the individual image write units. Such errors can be corrected to about a degree of 1/32 pixel when the pixel modulation circuit 25 controls the phase (delay) of pixel clocks on the basis of absolute pixel position setting data RG.

The laser chip 23 requires pixel position correction since the two laser scan positions are obliquely laid out to have a shallow angle and the beam interval varies due to attachment angle errors and variations, as shown in FIG. 11. Such errors can also be corrected to about a degree of 1/32 pixel when the pixel modulation circuit 25 controls the phase (delay) of pixel clocks on the basis of relative pixel position setting data RP.

Also, image size errors due to variations of optical mechanism precision in an optical path including the laser chip 23, polygonal mirror 18, f-θ lens 19, and photosensitive drum 20 must be corrected. This correction is implemented based on pixel frequency setting data DF by mounting a frequency synthesizer for changing the pixel clock frequency in the pixel modulation circuit 25. For this reason, the pixel modulation circuit 25 in the image write unit shown in FIG. 11 receives pixel position setting data DS for pixel position alignment.

4-drum/2-beam Pixel Modulation LSI

Figure 13:
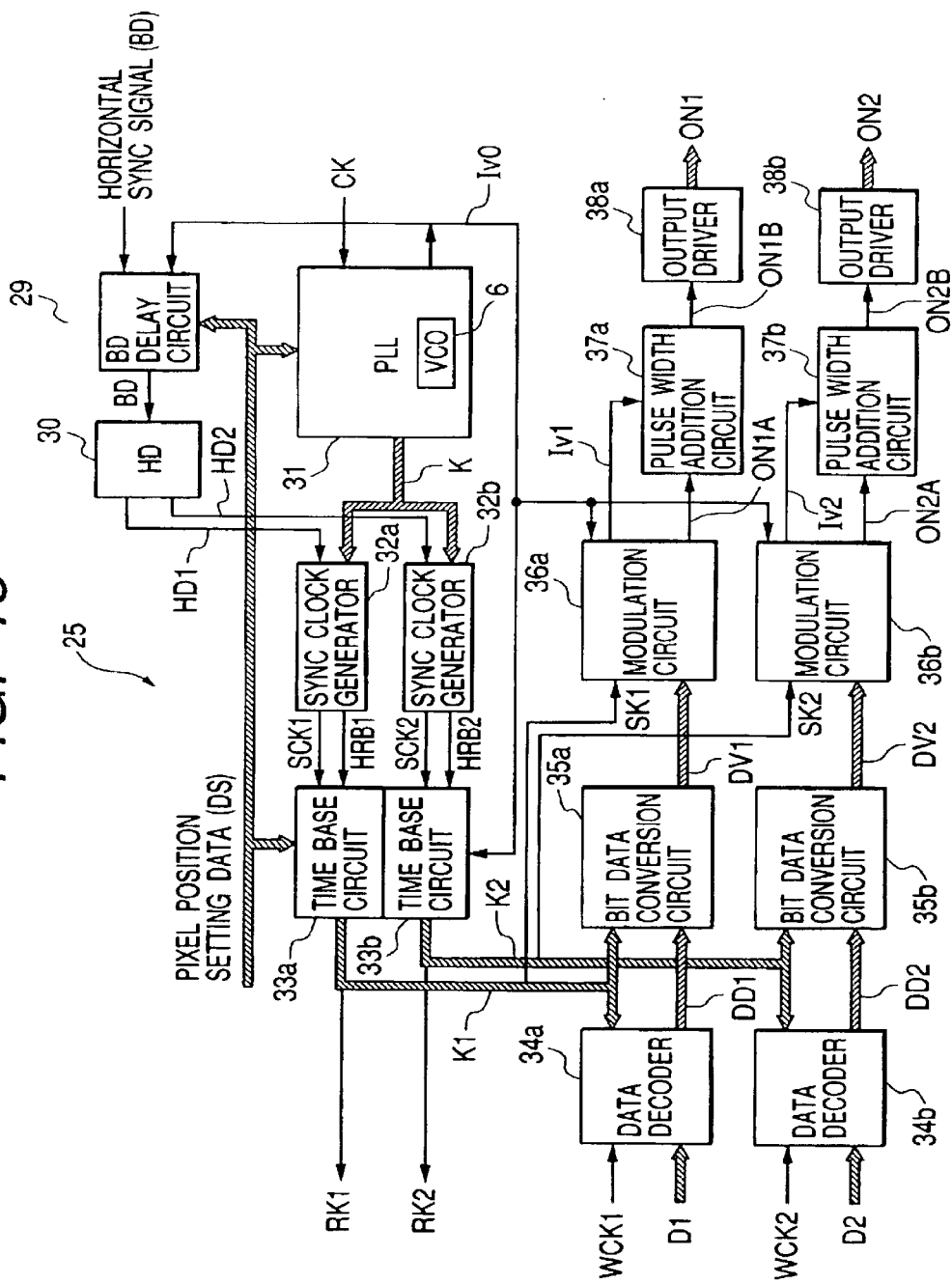
FIG. 13 is a block diagram showing a pixel modulation LSI for a 4-drum/2-beam machine.

FIG. 13 shows an example of the arrangement of an LSI system of the pixel modulation circuit 25 in the 4-drum/2-beam laser print engine (see FIG. 11) that mounts the frequency synthesizer.

A PLL circuit 31 that generates pixel clocks comprises the frequency synthesizer shown in FIG. 1. In FIG. 13, the circuit 31 outputs a control signal Iv0 to the variable frequency oscillating circuit 6 in place of clocks CK.

In FIG. 13, reference clocks CK are input to the PLL circuit 31 which also serves as a frequency synthesizer. The PLL circuit 31 outputs an 8-phase clock bus K including signals which have a frequency four times the pixel clock frequency and which are a 1/8 period (1/32 pixel) out of phase. The pixel position setting data DS is input to the PLL circuit 31.

In the PLL circuit 31, pixel frequency setting data for pixel position setting data DS is used as a control signal DF to the control logic circuit 7 in FIG. 1. The control current Iv0 of the variable frequency oscillating circuit (VCO) 6 that generates 8-phase clocks in the PLL circuit 31 is output. The horizontal sync signal BD is input to a BD delay circuit 29, which controls to delay the BD signal based on the pixel position setting data DS.

The BD delay circuit 29 receives the control current Iv0. The BD delay circuit 29 has an arrangement obtained by cascade-connecting delay circuits equivalent to variable delay circuits used in the variable frequency oscillating circuit 6 in the PLL circuit 31, and the connection points of the respective delay circuits output BD signals, the timings of which shift by a 1/32 pixel from each other. Hence, the frequency of the BD signal to be output is controlled in accordance with the output signal IVO from the PLL circuit 31.

In this case, a fine adjustment bit of the interdrum absolute pixel position setting data RG between in the pixel position setting data DS is used in delay control to obtain a desired BD signal, thus finely adjusting the inter-drum pixel position alignment to a 1/32 pixel.

The output BD signal is input to a horizontal sync signal separation circuit 30 and is separated into a horizontal sync signal HD1 for a leading laser beam and a horizontal sync signal HD2 for a trailing laser beam, as shown in FIG. 14.

The horizontal sync signals HD1 and HD2 are respectively input to sync clock generators 32a and 32b together with the 8-phase clock bus K output from the PLL circuit 31. The sync clock generators output sync clock signals SCK1 and SCK2 in synchronism with the input HD signals. The sync precision of each clock is a 1/32 pixel.

A 1-drum/1-beam machine suffices to have sync precision of about 1/8 pixel. However, in case of a 4-drum/2-beam machine, since color misregistration immediately changes color moire and tone, sync clock generator characteristics are required to have high precision.

In a color laser print engine, since tone reproduction of an image is important, PWM pixel modulation is normally used. In order to flexibly cope with digital image processing, modulation is done by dividing a pixel (To) by 32, as shown in FIG. 16B.

However, 32-bit pixel data per beam is huge and is impossible to implement. For this reason, pixel data D1 and D2 are input as 6-bit data to 32-bit mapping data decoders 34a and 34b together with write clocks WK1 and WK2. The data decoders 34a and 34b comprise, e.g., 64-address/32-bit SRAMs, and stored data is set to be a desired value in advance by the user.

32-bit data output from the data decoders 34a and 34b are converted into serial data, as shown in FIG. 15. For example, if the pixel frequency is 25 Mhz (40 ns), a signal process having modulation precision as very high as 1.25 ns is required. The pixel frequency is projected to rise further. The sync clocks SCK1 and SCK2 and HRB1 and HRB2 output from the sync clock generators 32a and 32b are respectively input to time base circuits 33a and 33b.

The time base circuit 33b includes an arrangement obtained by cascade-connecting variable delay circuits equivalent to those used in the VCO 6 in the PLL circuit 31, pixel clocks which shift by 1/32 pixel from each other are generated at respective connection points, and the beam interval can be adjusted with high precision by relative pixel position setting data RP in the input pixel position setting data DS. Furthermore, the time base circuits 33a and 33b use upper bits of the absolute pixel position setting data RG for coarse adjustment in pixel position alignment between drums.

FIG. 15 shows the contents of output signal buses K1 and K2 of the time base circuits 33a and 33b.

DK0 and DK1 are used as read timing clocks of the SRAMs in the data decoders 34a and 34b. K0 to K3 are input to (32→8) bit data conversion circuits 35a and 35b, and are converted into 8-bit data DV. If the setting data RG and RP are 5-bit data, a clock delay time Td shown in FIG. 14 as well as that in the BD delay circuit 20 is expressed by:

$$Td1=Td(0)+RG(4:0)\times(To/32)$$

$$Td2=Td(0)+RG(4:0)\times(To/32)+RP(4:0)\times(To/32)$$

As can be understood from these equations, the phases of pixel data DV1 and DV2 can be controlled with precision of a 1/32 pixel, and desired pixel modulation can be realized if data modulation is finally done at that timing. The 8-bit data DV1 and DV2 from the (32→8) bit data conversion circuits 35a and 35b are input to modulation circuits 36a and 36b together with sync clocks SK1 and SK2.

Each of the modulation circuits 36a and 36b has a delay chain circuit obtained by cascade-connecting variable delay circuits equivalent to those used in the VCO 6 in the PLL circuit 31. The modulation circuits 36a and 36b generate 8-phase clocks controlled to have delay amounts of a 1/32 pixel by DLL control, thus outputting 32-bit serial modulation signals ON1A and ON2A shown in FIG. 16B. Therefore, the frequency of clocks generated by the modulation circuits 36a and 36b is also controlled by the output signal from the PLL circuit 31.

The 32-bit serial modulation signals ON1A and ON2A are input to pulse width addition circuits 37a and 37b. A laser diode emits light not immediately after a current is supplied but has a given delay time due to the emission mechanism, and stops emission relatively immediately after the current is shut off.

FIGS. 17A and 17B show the operations of the pulse width addition circuits 37a and 37b.

When a pixel modulation driving current shown in FIG. 17A is supplied to a laser, the emission period decreases (narrows down), as shown in FIG. 17B. When a narrow pulse like P2 is supplied, the laser does not emit light, and normal emission control cannot be realized.

To solve this problem, when a pulse width for a given duration is added to each pixel modulation pulse, as shown in FIG. 17C, desired emission pulses are obtained, as shown in FIG. 17D. The pulse width addition circuits 37a and 37b include variable delay circuits equivalent to those used in the modulation circuits 36a and 36b, and respectively receive control currents Iv1 and Iv2 from the modulation circuits 36a and 36b.

In this way, a coefficient current is generated to add a given width to the pulse width, and high-precision control of 1/100 pixel or less is stably attained. Pixel modulation signals ON1B and ON2B output from the pulse width addition circuits 37a and 37b are input to output drivers 38a and 38b which output pixel modulation signals ON1 and ON2 to the LD driver 24.

Since the pixel modulation pulse signal is required to have high pulse width precision of less than 1 ns, a small signal differential output type is used.

The aforementioned pixel modulation circuit can be implemented by a CMOS LSI process, and a high degree of integration is expected.

An operation example in the laser print engine as the aforementioned image forming apparatus will be explained below.

In recent years, a color laser print engine is strongly demanded. In general, a print process using four color toners Ye, Cy, Mg, and Bk requires a print time four times that of a monochrome print process. Hence, such shortcoming is combated by a print engine which uses four photosensitive drums 20 in units of colors, and a laser that outputs two beams to write two lines at the same time.

Figure 18:
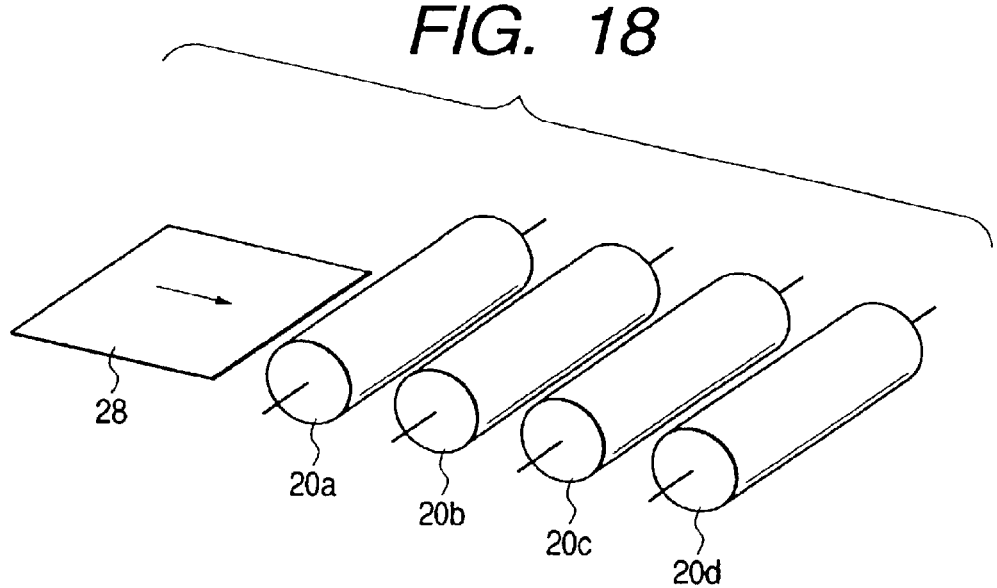
FIG. 18 is a perspective view showing the layout state of a 4-drum laser print engine.

FIG. 18 shows a schematic arrangement of the aforementioned 4-drum laser print engine.

Photosensitive drums 20a to 20d are laid out in line and are exclusively used for the four colors, and color toners are transferred in turn on a print paper sheet 28, thus forming a color image. The photosensitive drums 20a to 20d have image write units (FIG. 12) for forming electrostatic latent images by controlling the amounts of laser beams.

In this example, the above laser print engine (see FIG. 11) is characterized by periodically controlling an image size detector for detecting an image size at an interval of a predetermined number of pixels, and also periodically controlling the main phase selection circuit 5 and sub-phase selection circuit 4 in the aforementioned frequency synthesizer (see FIG. 1) at a period of the number of pixels obtained by dividing the predetermined number of pixels by a coefficient.

Operation Method in Laser Print Engine

An example of the operation method in the laser print engine will be explained below. Image size errors of each drum mainly occur due to variations of mechanical errors. For this reason, once the image size errors are corrected, errors occur again due to environmental variations and the number of printed images, and correction is required again. Hence, the image size control must be done by automatic control.

In the 4-drum color laser print engine, patch patterns used to measure an image size (FIG. 19) are printed every time a predetermined number of images are printed. The patch patterns are formed at a position PA that represents the start point of laser scan, and at a position PB that represents the end point of laser scan. These patch patterns are detected to obtain an image size.

Figure 19:
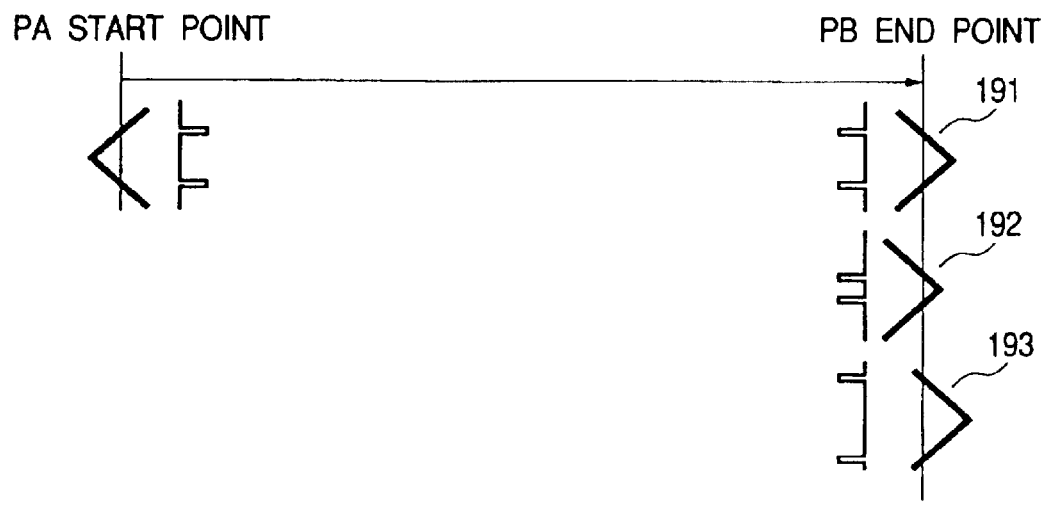
FIG. 19 is an explanatory view showing a patch pattern used to detect any image size error.

For example, when a desired image size is obtained, signals density-detected at the positions PA and PB become pulse signals having an equal interval, as indicated by 191 in FIG. 19. When the image size is small, the pulse interval at PB becomes small, as indicated by 192.

On the other hand, when the image size is large, the pulse interval at PB becomes large, as indicated by 193. In this manner, image size errors can be detected at a degree of 1/8 pixel. The distance between the positions PA and PB can be expressed by the number of pixels.

In the print engine, pixels are preferably used as a unit in place of frequencies.

The operation method of the frequency synthesizer of this embodiment in this case will be explained using a condition example to be described below.

Image size detection interval (PB−PA); N=8,000 pixels
Maximum image size setting range; ΔS=±16 pixels
Image size setting precision (at PB); Δs=1/8 pixel
Pixel clock phase control precision; Δθ=1/(4×32) pixels A phase rotation distribution period Tx is determined as a minimum value by:

$$Tx=N/(\Delta s/\Delta\theta)=500 \text{ pixels}$$

To implement a simple arrangement, minimum Tx is preferably set.

The frequency control of the frequency synthesizer can be made in units of periods Tx. For example, when the image size is decreased by a 1/8 pixel, a phase delay operation can be done once during the period Tx. When the image size is increased by a 1/8 pixel, a phase advance operation can be done once during the period Tx.

When the image size is decreased by 16 pixels, phase delay operation can be discretely done 128 times during the period Tx (1 phase rotation). When the image size is increased by 16 pixels, phase advance operation can be discretely done 128 times during the period Tx (1 phase rotation). When the image size detection interval changes depending on models, the Tx value can be prepared as distributed period data DIC, and can be input to the control logic circuit 7 together with the frequency setting data DF.

Figures 20, 21:
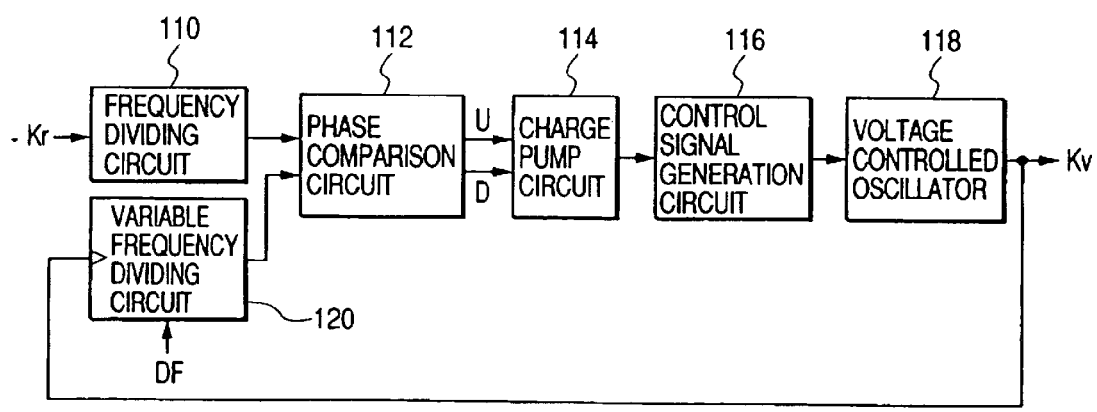
FIG. 20 is a view for explaining the operation of frequency control by the apparatus shown in FIG. 11.
FIG. 21 is a block diagram showing a conventional frequency synthesizer.

FIG. 20 shows the relationship between the frequency setting data DF (8 bits) and image size correction in the aforementioned image size setting operation.

Upon executing the aforementioned pixel position alignment process by a conventional frequency synthesizer of a frequency computation type, a large number of counters of complicated count values must be prepared, and digital pixel position correction cannot be attained.

In the frequency synthesizer of this embodiment, the phase comparison operation for determining the target output frequency can be done every output signal period, and PLL circuit blocks such as the variable frequency oscillating circuit 6, charge pump circuit 2, and the like can use conventional ones.

Note that the present invention may be applied to either a system constituted by a plurality of equipments (e.g., a host computer, interface device, reader, printer, and the like), or an apparatus consisting of a single equipment (e.g., a compact image processing device such as a PDA (personal data assistant) device, a copying machine, a facsimile apparatus, or the like).

The present invention can also be applied to a case wherein the invention is achieved by supplying a program to the system or apparatus. Also, the effects of the present invention can be obtained by supplying a storage medium, which stores a program represented by software for achieving the present invention to the system or apparatus, and reading out and executing a program code stored in the storage medium by a computer (or a CPU or MPU) of the system or apparatus.

In this case, the program code itself read out from the storage medium implements the functions of the above-mentioned embodiments, and the storage medium which stores the program code constitutes the present invention.

As the storage medium for supplying the program code, for example, a floppy disk, hard disk, optical disk, magneto-optical disk, CD-ROM, CD-R, magnetic tape, nonvolatile memory card (IC card), ROM (mask ROM, flash EEPROM, or the like), and the like may be used.

The functions of the above-mentioned embodiments may be implemented not only by executing the readout program code by the computer but also by some or all of actual processing operations executed by an OS (operating system) running on the computer on the basis of an instruction of the program code.

Furthermore, the functions of the above-mentioned embodiments may be implemented by some or all of actual processing operations executed by a CPU or the like arranged in a function extension board or a function extension unit, which is inserted in or connected to the computer, after the program code read out from the storage medium is written in a memory of the extension board or unit.

Many widely different embodiments of the present invention may be constructed without departing from the spirit and scope of the present invention. It should be understood that the present invention is not limited to the specific embodiments described in the specification, except as defined in the appended claims.

What is claimed is:

1. A frequency synthesizer for generating an output signal having a frequency which is associated with a frequency of a reference clock, comprising:

oscillating means for generating a clock signal group including a plurality of clock signals which have a phase difference associated with a period of the output signal;

comparison clock generation means for selecting two clock signals corresponding to a target frequency of the output signal from the plurality of clock signals and for generating a comparison clock having a phase associated with phases of the two selected clock signals;

phase difference detection means for detecting a phase difference between the reference clock and the comparison clock; and frequency control means for controlling an oscillating frequency of said oscillating means in accordance with an output of said phase difference detection means.

2. A frequency synthesizer according to claim 1, wherein said oscillating means generates n clock signals having phase differences obtained by substantially equally dividing the period of the output signal into n phases.

3. A frequency synthesizer according to claim 2, wherein said comparison clock generation means comprises selection means for selecting two clock signals having neighboring phases from the plurality of clock signals, and generation means for generating the comparison clock on the basis of the two selected clock signals.

4. A frequency synthesizer according to claim 3, wherein said comparison clock generation means outputs a signal having one of m phases obtained by substantially equally dividing the phase difference between the two selected signals into m phases, as the comparison clock.

5. A frequency synthesizer according to claim 1, wherein said comparison clock generation means periodically changes a phase of the comparison lock.

6. A frequency synthesizer according to claim 5, wherein said comparison clock generation means determines a period of a change in phase of the comparison clock in accordance with a target frequency of the output signal.

7. A frequency synthesizer for generating a output signal having a frequency which is associated with a frequency of a reference clock, comprising:
- oscillating means for generating a clock signal group including a plurality of first clock signals having phase differences obtained by equally dividing a period o the output signal into n phases;
- selection means for selecting two clock signals having neighboring phases from the plurality of clock signals;
- comparison clock generation means for outputting a signal having one of m phases obtained by substantially equally dividing the phase difference between the two selected signals into m phases, as the comparison clock;
- phase difference detection means for detecting a phase difference between the reference clock and the comparison clock; and
- frequency control means for controlling an oscillating frequency of said oscillating means in accordance with an output of said phase difference detection means.

8. An image forming apparatus comprising:
- oscillating means for generating a clock signal group including a plurality of clock signals which have a phase difference associated with a period of an output signal;
- comparison clock generation means for generating a comparison clock by selectively using the plurality of clock signals;
- phase difference detection means for detecting a phase difference between the reference clock and the comparison clock;
- frequency control means for controlling an oscillating frequency of said oscillating means in accordance with an output from said phase difference detection means;
- modulation means for modulating image data on the basis of an output from said frequency control means;
- image forming means for forming an image on the basis of the image data modulated by said modulation means; and
- comparison clock control means for controlling operation of said comparison clock generation means on the basis of a size of an image to be formed by said image forming means.

9. An apparatus according to claim 8, wherein said comparison clock generation means comprises phase control means for controlling a phase of the comparison clock on the basis of a target frequency of the output signal.

10. An apparatus according to claim 9, wherein said phase control means determines the target frequency in accordance with a size of an image to be formed by said image forming means.

11. An apparatus according to claim 8, wherein said modulation means generates a clock having a frequency corresponding to an output of said frequency control means, and modulates the image data using the generated clock.

12. An apparatus according to claim 8, wherein said image forming means comprises a plurality of image forming units for forming images of different colors on a single recording medium on the basis of the image data modulated by said modulation means, and said comparison clock control means controls the operation of said comparison clock generation means so as to correct sizes of the images of the respective colors to be formed by said plurality of image forming units.

13. A frequency synthesizer for generating an output sign having a frequency which is associated with a frequency of a reference clock, comprising:
- oscillating means for generating a clock signal group including a plurality of clock signals having phase differences obtained by equally dividing a period of the output signal into n phases;
- comparison clock generation means for selecting two clock signals having neighboring phases from the plurality of clock signals and for generating a comparison clock on the basis of the two selected clock signals;
- phase difference detection means for detecting a phase difference between the reference clock and the comparison clock; and
- frequency control means for controlling an oscillating frequency of said oscillating means in accordance with an output of said phase difference detection means.

14. A frequency synthesizer according to claim 13, wherein said comparison clock generation means outputs a signal having one of m phases obtained by substantially equally dividing the phase difference between the two selected signals into the m phases as the comparison clock.

15. A frequency synthesizer according to claim 13, wherein said comparison clock generation means periodically changes a phase of the comparison clock.

16. A frequency synthesizer according to claim 15, wherein said comparison clock generation means determines a period of a change in phase of the comparison clock in accordance with a target frequency of the output signal.

* * * * *

UNITED STATES PATENT AND TRADEMARK OFFICE
CERTIFICATE OF CORRECTION

PATENT NO. : 6,807,244 B2  
DATED : October 19, 2004  
INVENTOR(S) : Somei Kawasaki et al.

It is certified that error appears in the above-identified patent and that said Letters Patent is hereby corrected as shown below:

<u>Column 1,</u>  
Line 47, delete "th variable" and insert -- the variable --.

<u>Column 5,</u>  
Lines 2 and 4, delete "P0" and insert -- Po --.

<u>Column 6,</u>  
Line 58, delete "fr-fv=" and insert -- fv-fr= --.

<u>Column 7,</u>  
Line 63, delete "1/00 periods" and insert -- 1/100 periods --.

<u>Column 17,</u>  
Line 13, delete "period o the" and insert -- period of the --.

Signed and Sealed this

Twenty-first Day of March, 2006

JON W. DUDAS  
*Director of the United States Patent and Trademark Office*